(12) United States Patent
Shin

(10) Patent No.: US 7,914,951 B2
(45) Date of Patent: *Mar. 29, 2011

(54) METHOD OF CORRECTING PATTERN CRITICAL DIMENSION OF PHOTOMASK

(75) Inventor: Jae Cheon Shin, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 378 days.

This patent is subject to a terminal disclaimer.

(21) Appl. No.: 12/108,189

(22) Filed: Apr. 23, 2008

(65) Prior Publication Data

US 2009/0075180 A1 Mar. 19, 2009

(30) Foreign Application Priority Data

Sep. 18, 2007 (KR) ........................ 10-2007-0094653

(51) Int. Cl.
*G03F 1/00* (2006.01)
(52) U.S. Cl. .......................................................... 430/5
(58) Field of Classification Search ........................ 430/5
See application file for complete search history.

(56) References Cited

U.S. PATENT DOCUMENTS

| 6,110,624 | A  | * | 8/2000  | Hibbs et al. ....................... 430/5 |
| 6,406,818 | B1 | * | 6/2002  | Zemen et al. ...................... 430/5 |
| 7,294,440 | B2 |   | 11/2007 | Rankin et al. |
| 2005/0048377 | A1 | * | 3/2005 | Yang ................................. 430/5 |
| 2008/0160429 | A1 | * | 7/2008 | Jeong ............................... 430/5 |
| 2008/0280214 | A1 | * | 11/2008 | Ryu ................................. 430/5 |

FOREIGN PATENT DOCUMENTS

| KR | 10-2006-0133419 | 12/2006 |
| KR | 10 2007 0068910 | 7/2007 |

* cited by examiner

*Primary Examiner* — Stephen Rosasco
*Assistant Examiner* — John Ruggles
(74) *Attorney, Agent, or Firm* — Marshall, Gerstein & Borun LLP

(57) ABSTRACT

A method of correcting a pattern critical dimension of a photomask includes forming a phase shift layer and a light blocking pattern on a substrate, measuring a critical dimension (CD) of the light blocking pattern, and forming a negative resist pattern that has a relatively smaller CD than the CD of the light blocking pattern on the light blocking pattern, and correcting the CD of the light blocking pattern by etching the light blocking pattern exposed by the negative resist pattern. The method may further include forming a phase shift pattern by etching the phase shift layer exposed by the corrected light blocking pattern and the negative resist pattern as an etch mask, and removing the negative resist pattern and the corrected light blocking pattern.

5 Claims, 5 Drawing Sheets

US 7,914,951 B2

METHOD OF CORRECTING PATTERN CRITICAL DIMENSION OF PHOTOMASK

CROSS-REFERENCE TO RELATED APPLICATION

The priority of Korean patent application No. 10-2007-0094653, filed on Sep. 18, 2007, the disclosure of which is incorporated by reference in its entirety, is claimed.

BACKGROUND OF THE INVENTION

1. Field of the Disclosure

The present invention generally relates to a photomask, and more particularly, to a method of correcting a pattern critical dimension (CD) of a photomask.

2. Brief Description of Related Technology

Photomasks are used to form a pattern on a semiconductor substrate during the manufacture of a semiconductor device. Photolithography is used to transfer a pattern on the photomask onto a wafer. As semiconductor devices become more highly integrated, the size of the patterns on a photomask becomes smaller and smaller.

A correction process is performed to correct the CD of a photomask pattern and to improve the CD accuracy of the photomask pattern. Specifically, a phase shift layer is formed on a transparent substrate, and a light blocking pattern that selectively exposes the phase shift layer is formed on the phase shift layer. A CD of the light blocking pattern is measured. The CD of the light blocking pattern is corrected by etching the light blocking pattern using a separate correction mask. The exposed phase shift layer is patterned using the corrected light blocking pattern as an etch mask.

The separate correction mask is formed by applying a resist coating to the transparent substrate having the phase shift layer and the light blocking pattern, and performing exposure and development processes. The correction mask is formed using a typical resist layer, for example, a positive resist layer. During the development process, the portion of the positive resist layer exposed to an electron beam is removed by a developing solution. The portion of the positive resist layer not exposed to the electron beam remains and becomes a mask pattern for the correction process.

When the separate correction mask is formed, foreign materials such as particles may adhere to the resist layer. These foreign materials prevent a portion of the resist layer that should be exposed from being exposed and removed during the development process. As a result, resist residue may remain on the surface of the phase shift layer. The resist residue may cause a bridging defect of the phase shift patterns when the phase shift layer is etched. The bridging defect may degrade the quality of the photomask and cause a patterning defect during the wafer exposure process.

SUMMARY OF THE INVENTION

Embodiments of the present invention are directed to a method of correcting a pattern critical dimension (CD) of a photomask.

In one embodiment, a method of correcting a CD of a photomask includes: forming a phase shift layer and a light blocking pattern on a substrate; measuring a CD of the light blocking pattern; forming a negative resist pattern that has a relatively smaller CD than the CD of the light blocking pattern on the light blocking pattern; correcting the CD of the light blocking pattern by additionally etching the light blocking pattern exposed by the negative resist pattern; forming a phase shift pattern by etching the phase shift layer exposed by the corrected light blocking pattern and the negative resist pattern as an etch mask; and removing the negative resist pattern and the corrected light blocking pattern.

In another embodiment, a method of correcting a CD in a photomask includes: forming a light blocking pattern on a substrate; measuring a CD of the light blocking pattern; forming a negative resist pattern that has a relatively smaller CD than the CD of the light blocking pattern on the light blocking pattern; correcting the CD of the light blocking pattern by etching the light blocking pattern exposed by the negative resist pattern; and removing the negative resist pattern.

BRIEF DESCRIPTION OF THE DRAWINGS

For a more complete understanding of the disclosure, reference should be made to the following detailed description and accompanying drawings.

Figure 1:
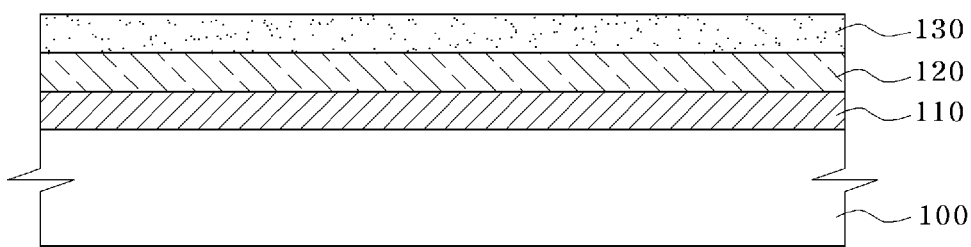
FIGS. 1 to 9 illustrate a method of correcting a pattern critical dimension (CD) of a photomask according to the present invention.

While the disclosed method is susceptible to embodiments in various forms, specific embodiments are illustrated in the drawings (and will hereafter be described), with the understanding that the disclosure is intended to be illustrative, and is not intended to limit the invention to the specific embodiments described and illustrated herein.

DETAILED DESCRIPTION OF SPECIFIC EMBODIMENTS

Referring to FIG. 1, a phase shift layer 110, a light blocking layer 120, and a first resist layer 130 are formed on a transparent substrate 100. The phase shift layer 110 may be formed of a material capable of shifting the phase of the transmitted light, for example, a MoSiN layer. The light blocking layer 120 may be formed of a material capable of blocking the transmitted light, for example, a Cr layer. The first resist layer 130 may be formed, for example, using a positive resist layer.

Figure 2:
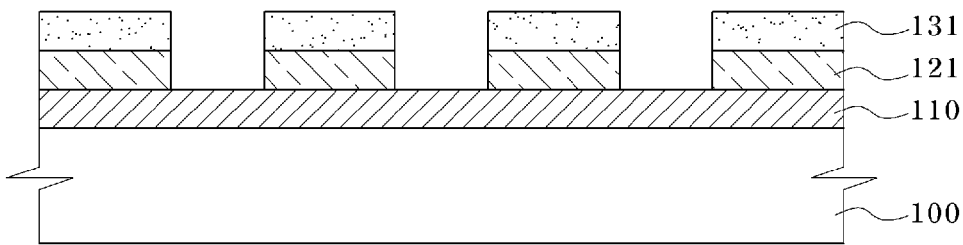

Referring to FIG. 2, a first resist pattern 131 that selectively exposes the light blocking layer 120 is formed using a lithography process. Specifically, an exposure process is performed on the first resist layer 130 using an electron beam. A development process, using a developing solution, is performed on the exposed first resist layer 130 to form a first resist pattern 131 that selectively exposes the light blocking layer 120. When the first resist pattern 131 is formed using a positive resist layer, for example, a portion of the positive resist layer irradiated by the electron beam is removed by the developing solution. A portion of the positive resist layer that is not irradiated remains on the light blocking layer 120 and becomes the first resist pattern 131. The light blocking layer 120 is etched using the first resist pattern 131 as an etch mask to form a light blocking pattern 121 that selectively exposes the phase shift layer 110.

Figure 3:
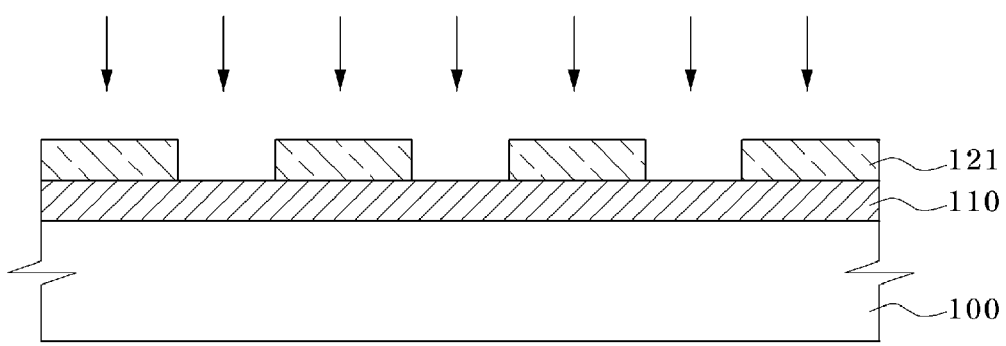

Referring to FIG. 3, after the first resist pattern 131 is removed, a CD of the light blocking pattern 121 is measured using a critical dimension measuring apparatus. The light blocking pattern 121 is used as an etch barrier layer for a phase shift pattern 111. A CD of the phase shift pattern 111 is determined by the CD of the light blocking pattern 121. Accordingly, the CD of the light blocking pattern 121 should be accurately controlled in order to obtain an accurate CD of the phase shift pattern 111. For this purpose, the CD of the light blocking pattern 121 is first measured. A CD correction process that is based on the measured CD of the light blocking pattern 121 is performed to correct the CD of the light blocking pattern 121.

Figure 4:
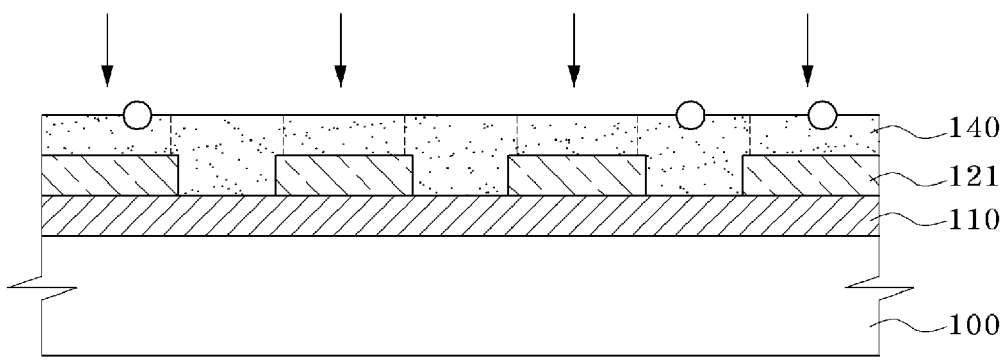

Referring to FIG. 4, a second resist layer 140 is formed on the transparent substrate 100 on which the phase shift layer 110 and the light blocking pattern 121 are formed. The second resist layer 140 may be formed, for example, using a negative resist layer. An exposure process is performed on the second resist layer 140 using a typical electron beam. During formation of the second resist layer 140 and the exposure process, foreign materials, such as particles, may adhere to the surface of the second resist layer 140.

Figure 5:
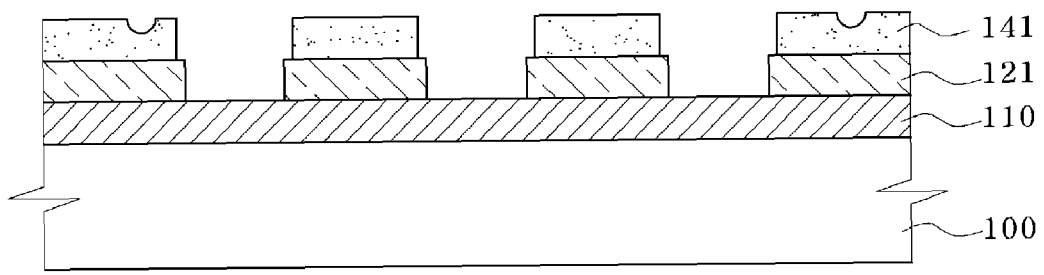

Referring to FIG. 5, a developing process is performed using a developing solution to form a second resist pattern 141 that exposes a portion of the light blocking pattern 121. The second resist pattern 141 is used as a correction mask for a CD correction process. The second resist pattern 141 is formed so that the light blocking pattern 121 may be exposed by a difference (ΔCD) between the measured CD of the light blocking pattern 121 and a CD of a target pattern. When a negative resist layer is used, for example, a portion of the second resist layer 140 that is not irradiated by the electron beam is removed by the developing solution. A portion of the second resist layer 140 that is irradiated by the electron beam remains on the light blocking pattern 121 and becomes the second resist pattern 141, which may be used as a correction mask. The foreign materials adhering to the portion of the second resist layer 140 that is not irradiated by the electron beam are removed by the developing solution along with the portion of the second resist layer 140 not irradiated by the electron beam. A bridging defect of the phase shift layer 110 may be prevented because the foreign materials do not remain on the portion of the phase shift layer 110 exposed between the light blocking pattern 121.

After the second resist pattern 141 is formed, the CD of the second resist pattern 141 may be measured. The second resist pattern 141 is irradiated by the electron beam without being damaged by the electron beam and becomes solid. A loss of the second resist pattern 141 may be prevented, even though a subsequent cleaning process is performed. Furthermore, when the CD of the second resist pattern 141 is measured, the CD reproducibility may be ensured.

A small pin hole defect may be caused by removal of the foreign materials adhering to the surface of the second resist layer 140 during the development process. The pin hole defect occurs within an acceptable range of CD error and does not affect the correction process.

Furthermore, when the second resist pattern 141 is formed, foreign materials having a relatively large size may prevent a portion of the second resist pattern 141 from being formed on the light blocking pattern 121. The CD correction process etches the light blocking layer 120 by a predetermined dimension within an error range of the CD correction. If some of the second resist pattern 141 is lost, a CD difference of approximately 3 to 5 nm results. The CD difference of approximately 3 to 5 nm is included within the specified range of the mask CD uniformity, and therefore does not affect the mask CD uniformity.

Figure 6:
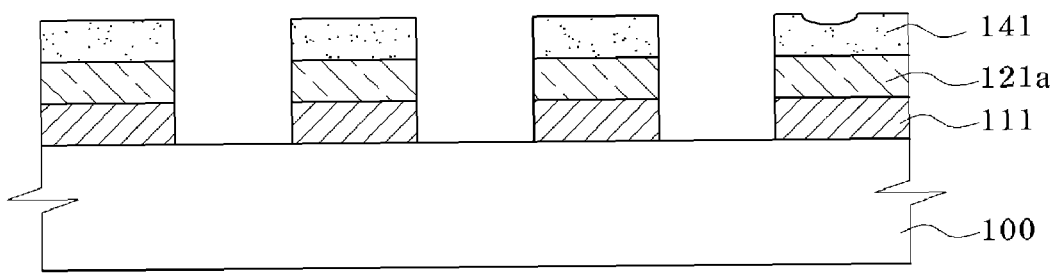

Referring to FIG. 6, to correct the CD of the light blocking pattern 121, the light blocking pattern 121 is etched at a predetermined width, using the second resist pattern 141 as an etch mask. The predetermined width may be, for example, a CD difference between the CD of the light blocking pattern 121 and the CD of a target pattern. By correcting the CD of the corrected light blocking pattern 121a, the phase shift pattern 111 may be formed with a CD that substantially corresponds to the predetermined CD of the target pattern.

A phase shift pattern 111 is formed by etching the exposed phase shift layer 110, using the corrected light blocking pattern 121a as an etch mask. The phase shift pattern 111 is etched so as to have the same CD as the CD of the corrected light blocking pattern 121a, which is the same CD as a CD of the target pattern. The second resist pattern 141 may be etched during the CD correction process of the light blocking pattern 121 and the etching process of the phase shift pattern 111. By correcting the CD of the light blocking pattern 121 before the phase shift pattern 111 is formed, the CD accuracy of the phase shift pattern 111 may be enhanced. In addition, a bridging defect of the phase shift pattern 111 may be prevented by using a negative resist layer as the correction mask for the correction process. Additionally, since the pattern CD may be corrected during the manufacturing process of the phase shift layer 110 mask, the quantity of the discarded masks may be reduced and the manufacturing costs may also be saved.

Figure 7:
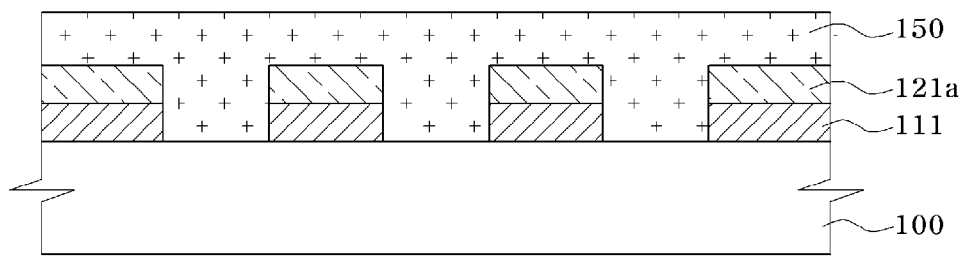

Referring to FIG. 7, the second resist pattern 141 is removed, and a third resist layer 150 is formed on the transparent substrate 100 on which the corrected light blocking pattern 121a and the phase shift pattern 111 are formed. The third resist layer 150 may be formed of a positive resist layer, but is not limited thereto.

Figure 8:
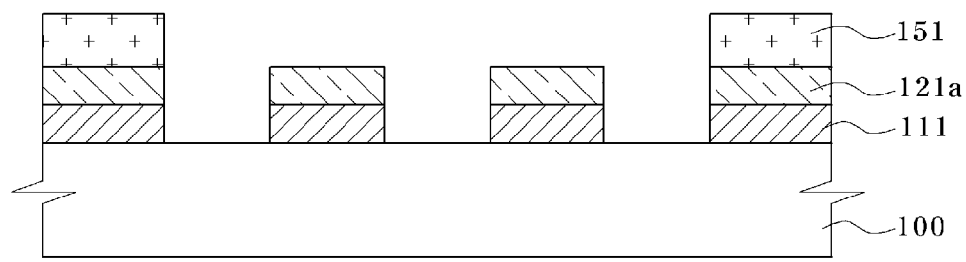

Referring to FIG. 8, a third resist pattern 151 is formed by performing an exposure process and a development process on the third resist layer 150. Formation of the third resist pattern 151 exposes a predetermined region of the transparent substrate 100. The third resist pattern 151 may be disposed, for example, such that a main region that shifts the phase of a transmitted light is exposed.

Figure 9:
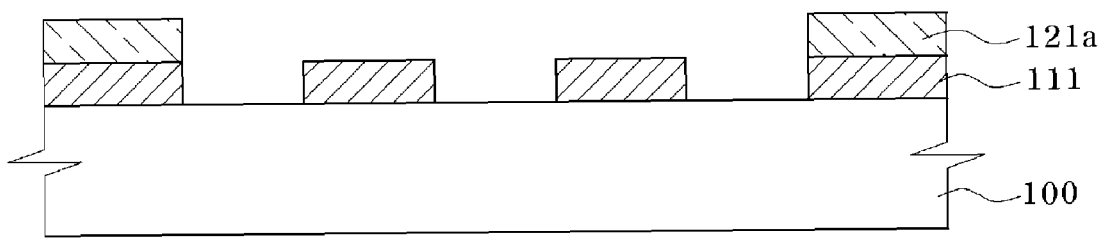

Referring to FIG. 9, the light blocking pattern 121a exposed by the third resist pattern 151 is etched and the third resist pattern 151 is removed. A laminate structure of the phase shift pattern 111 and the light blocking pattern 121a is formed on one portion of the transparent substrate 100, and only the phase shift pattern 111 is formed on another portion of the transparent substrate 100.

The specific embodiments of the present invention have been described above for illustrative purposes. Those skilled in the art will appreciate that various modifications, additions, and substitutions are possible, without departing from the scope and spirit of the invention as recited in the accompanying claims.

What is claimed is:

1. A method of correcting a pattern critical dimension of a photomask, the method comprising:
    forming a phase shift layer and a light blocking pattern on a substrate;
    measuring a critical dimension of the light blocking pattern;
    forming a negative resist pattern on the light blocking pattern, wherein the negative resist pattern has a relatively smaller critical dimension than the critical dimension of the light blocking pattern;
    etching the light blocking pattern exposed by the negative resist pattern to correct the critical dimension of the light blocking pattern;
    etching the phase shift layer, using the corrected light blocking pattern and the negative resist pattern as an etch mask, to form a phase shift pattern; and,
    removing the negative resist pattern and a portion of the corrected light blocking pattern.

2. The method of claim 1, wherein the phase shift layer comprises a MoSiN layer, and the light blocking pattern comprises a Cr pattern.

3. The method of claim 1, wherein the negative resist pattern is formed such that the light blocking pattern is exposed by a difference between the critical dimension of the light blocking pattern and a critical dimension of a target pattern.

4. The method of claim 1, wherein correcting the critical dimension of the light blocking pattern comprises etching the light blocking pattern by a difference between the critical dimension of the light blocking pattern and a critical dimension of a target pattern.

5. The method of claim 1, wherein forming the negative resist pattern comprises:

forming a negative resist layer on the substrate where the light blocking pattern is formed;

selectively irradiating an electron beam onto the negative resist layer; and removing the negative resist layer not irradiated by the electron beam and removing any foreign material present on a surface of the negative resist layer to form the negative resist pattern.

* * * * *